United States Patent [19]

Milberger et al.

[11] Patent Number: 4,469,961
[45] Date of Patent: Sep. 4, 1984

[54] FAST SWITCHING DRIVER FOR INDUCTIVE LOAD, SUCH AS A PHASE SHIFTER

[75] Inventors: Walter E. Milberger, Severna Park; Stephen F. Payer, Linthicum, both of Md.

[73] Assignee: The United States of America as represented by the Secretary of the Air Force, Washington, D.C.

[21] Appl. No.: 403,214

[22] Filed: Jul. 29, 1982

[51] Int. Cl.³ ............................ H03K 3/01; H03K 3/26
[52] U.S. Cl. ..................................... 307/270; 307/495; 307/255; 333/24.1
[58] Field of Search ............... 307/255, 270, 282, 495, 307/544; 333/24.1; 343/368, 371, 372

[56] References Cited

U.S. PATENT DOCUMENTS 3,988,686 10/1976 Beall et al. .......................... 333/24.1

Primary Examiner—Eli Lieberman
Attorney, Agent, or Firm—Donald J. Singer; Bernard E. Franz

[57] ABSTRACT

A dual voltage inductive coil driver is used to rapidly switch between current levels in phase shifters. This approach provides a large voltage swing during the transient period, and then provides a low-dissipation low-voltage source during the steady state condition. The dual mode uses a linear low voltage loop and a nonlinear high voltage loop in the driver. The nonlinear loop may operate from the threshold or difference between either the input reference and coil current or input reference and coil voltage.

11 Claims, 10 Drawing Figures

FAST SWITCHING DRIVER FOR INDUCTIVE LOAD, SUCH AS A PHASE SHIFTER

RIGHTS OF THE GOVERNMENT

The invention described herein may be manufactured and used by or for the Government of the United States for all governmental purposes without the payment of any royalty.

BACKGROUND OF THE INVENTION

This invention relates to a fast switching driver for changing the current through an inductive load, and more particularly to a driver for an inductor of a phase shifting device.

Phased array antenna systems are well known, in which the beam can be steered by varying the relative phase shift between the elements of the array. The use of Fox phase shifters as RF phase control elements is quite common in phased array antennas. A book by M. I. Skolnik, "Introduction to Radar Systems", McGraw Hill Book Co., 1962, describes array antennas in section 7.7, pages 294–320, phase shifting devices for such arrays on pages 307–311, and the Fox device in particular on pages 308–309, with references on page 351 to articles by A. G. Fox et al in *Proc. IRE*, December 1947, and *Bell System Tech J*, January 1955. The Fox phase shifter is based on the properties of circularly polarized waves in round waveguide. It consists of three sections of round waveguide, e.g., two quarter and one half wave plate. When a linear polarized wave is injected at one end the RF signal is changed from vertical to circular polarization at the input to the half wave plate. The output of that plate changes the right hand circular polarization to a left hand circular polarization. That wave is then converted again to a linear polarized wave at the output of the second quarter wave plate. When the half wave plate is rotated mechanically or by electrical means, a phase shift occurs. The original Fox phase shifter was a mechanical type. Later versions use sine/cosine coils, which rotate a quadrapole magnetic field. This rotation causes the half wave plate to rotate electronically. The driver for the electronic control is the subject of the present invention.

The driver has equal application for line stretcher types of phase shifters as employed in microwave circulators. In this type of phase shifter the apparent electrical length of the waveguide is changed by controlling the magnetic field transversing ferrite slabs attached to the inner walls of the waveguide.

The significant aspect of these phase shift devices with respect to the invention is that they constitute an inductive load for the driver, in which the current must be rapidly switched from one level to another or reversed in direction, with a relatively long steady state condition between the switching intervals. There are many devices other than phase shifters which provide similar inductive loads for current drivers.

Present drivers for these phase shifters or other inductive loads make use of a sufficiently high voltage applied via a device such as a transistor so that the required rate of change of current may be achieved. This causes high driver losses. The dissipation in the driver is equal to the difference between the transient and steady state voltages multiplied by the inductor current. When very fast change is required, the driver dissipation may be ten times more than that of the inductor coil.

Another way to minimize the switching time of inductive phase shift drivers for a magnetic circuit of given reluctance, is to decrease the number of turns. This is because the inductance is directly proportional to the square of the number of turns. This approach is limited by phase shifter coil geometry and the added current requirement placed on driver transistors.

SUMMARY OF THE INVENTION

An object of the invention is to provide a driver for an inductive load, such as a phase shifter, which greatly reduces the power dissipation. This would lead to a large decrease in cooling equipment required, which would result in a significant size and weight reduction of a system.

According to the invention, a dual voltage driver is introduced. This approach provides a large voltage swing during the transient period at least equal to the inductance of the load times the rate of change of the current (L di/dt). It then provides a low dissipation low voltage source during the steady state, or "holding phase" condition.

To implement the dual mode approach both linear and nonlinear loops are used in the driver circuit. The linear loop is controlled by feedback established from the coil current monitor. The nonlinear loop may operate from the difference between either the input reference and coil current or input reference and coil voltage. See FIG. 1B. This differential corresponds to the transient coil voltage. Thus, a direct monitor of coil voltage can be used to control the nonlinear switch.

DETAILED DESCRIPTION

Introduction

The circuit techniques related herein provide a fast switching, high efficiency inductive coil driver. It is used to rapidly switch Fox-type rotary field phase shifters applied in phased array adaptive sidelobe cancellation techniques. The circuit provides high efficiency by dissipating low power in both the transient and "holding phase" phase shifter ranges of operation.

A look at antenna systems of the past and the present indicates that the use of Fox Phase Shifters, as an RF phase control element, has been and will continue to be quite common in phased array antennas. The Fox Phase Shifters presently in use in a number of systems all exhibit somewhat similar propteries. The circuitry used to drive these phase shifters is likewise quite similar, but each and every one is different. There is a need for a phase shifter driver, designed to be capable of handling the requirements of present systems and the faster systems that will be developed in the future.

A review of the phase shifter driver requirements for adaptive cancellor, adaptive array and Sotas Systems, that use Fox Phase Shifters, indicates that it should be possible to develop a driver capable of operating in all four systems. The phase shifters exhibit inductances of between 1.5 and 4.5 mh, and coil resistances ranging from 2.0 to 12 ohms with sense resistors in use being between 1 and 5 ohms. The switching requirements range from 1.4 A in 570 $\mu$sec to 3.6 A in 650 $\mu$sec and the holding currents required fall between 0.7 and 1.8 amps which is being accomplished with supplies that are typically 130 v. A phase shifter driver capable of operating as a universal driver would need to be able to drive phase shifters with coil resistances of at least 5 ohms and an inductance of 4 mh. The driver should be capable of holding currents of $\pm 2$ amps and be able to switch in less than 50 $\mu$sec and dissipate less than 5 watts during steady state operation.

The Fox phase shifter driver is generally a feedback push pull current driver that has high steady state power dissipation. The high steady state power dissipation is brought about by the fact that the driver, in order to achieve desired switching times with inductive loads, must be capable of high output voltages during switching, but only requires low voltage output to maintain steady state current. The high voltage for switching is dropped across the output transistors during steady state operation causing high dissipation.

It is evident that the voltage necessary to be consistent with fast switching of an inductive load is not necessary once the driver has reached the steady state, and that this voltage could be reduced to some lower value once the steady state has been achieved, reducing the steady state power dissipation.

Previous Methods

Figure 1A:
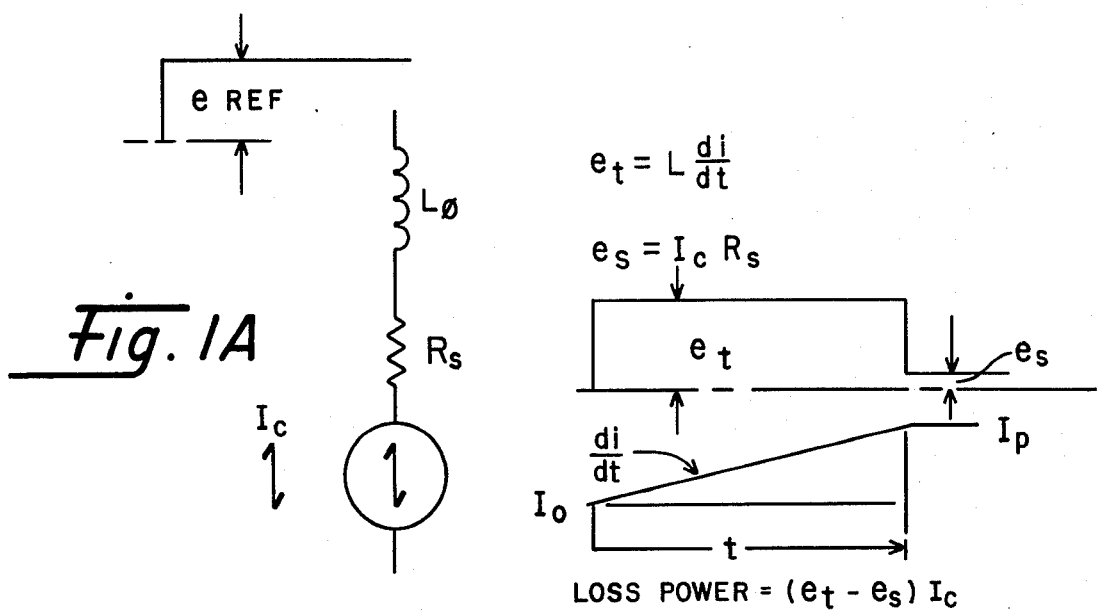
FIG. 1A shows the voltage and current in an inductor during a switching transient and steady state.

FIG. 1A depicts the basic parameters involved in controlling the transient and steady-state current in an inductive element. During the transient condition, and coil voltage corresponds to L(di/dt); in the steady case, the voltage is equal to $I_cR_s$. Normally, the transient voltage ($e_t$) is much greater than the steady state voltage ($e_s$). This causes high driver losses when the current amplifier is supplied from a fixed voltage supply. This dissipation corresponds to the difference between the transient and steady state coil voltages ($e_t-e_s$) times the coil current $I_c$. When very fast phase change, i.e., high $e_t$, is required, the driver dissipation may be ten times more than that of the coil.

Dual Mode

Figure 1B:
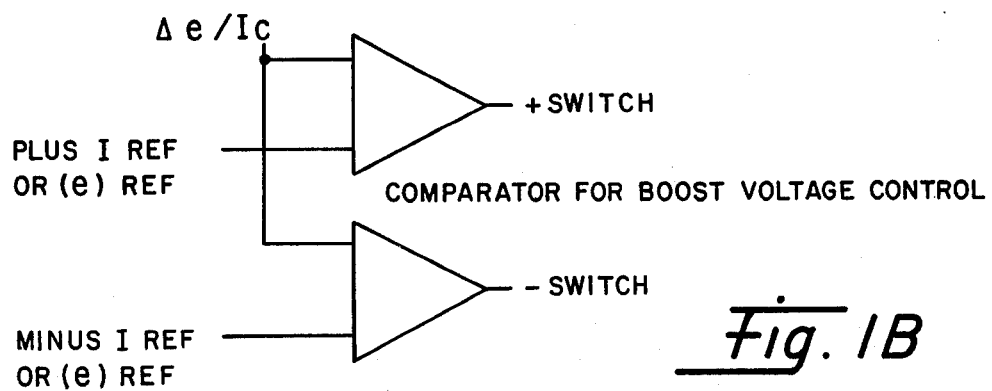
FIG. 1B is a functional block diagram of a comparator for boost voltage control.
Figure 1C:
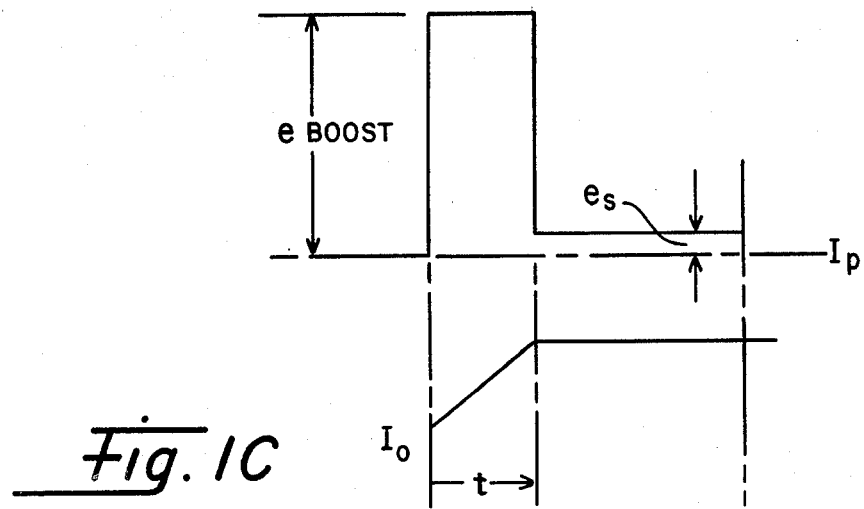
FIG. 1C shows the voltage and current in the inductor with the dual voltage feature.

To circumvent power loss imposed by a fixed voltage driver, a dual voltage driver is introduced. This approach provides a large voltage swing during the transient period to satisfy the L(di/dt) requirement. It then provides a low dissipation low voltage source during the steady state, or "holding phase", condition. FIG. 1C shows how the dual voltage mode approach relates to switching time, drive voltage, and current. To implement the dual mode approach both linear and non-linear loops are used in the driver circuit. The linear loop is controlled by feedback established from the coil current monitor. The non-linear loop may operate from the difference between either the input reference and coil current or input reference and coil voltage. See FIG. 1(B). This differential corresponds to the transient coil voltage. Thus, a direct monitor of coil voltage can be used to control the non-linear switch.

Figure 3:
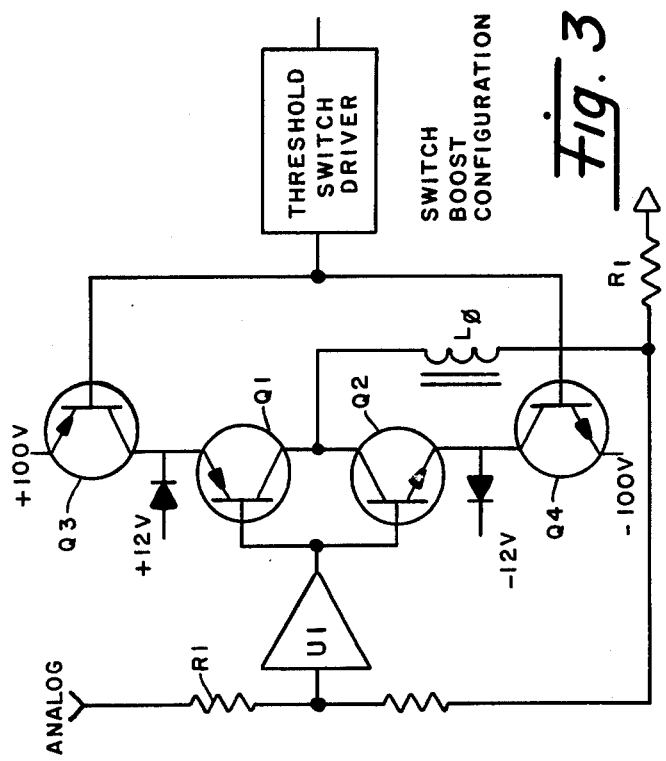
FIGS. 2 and 3 are simplified schematic drawings of two configurations using the dual voltage feature.
Figure 4A:
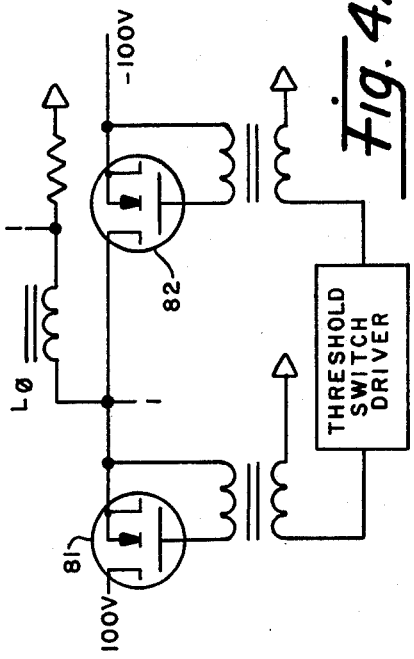
FIGS. 4A and 4B are schematics showing how to use FET's for the high voltage transistors.
Figure 2:
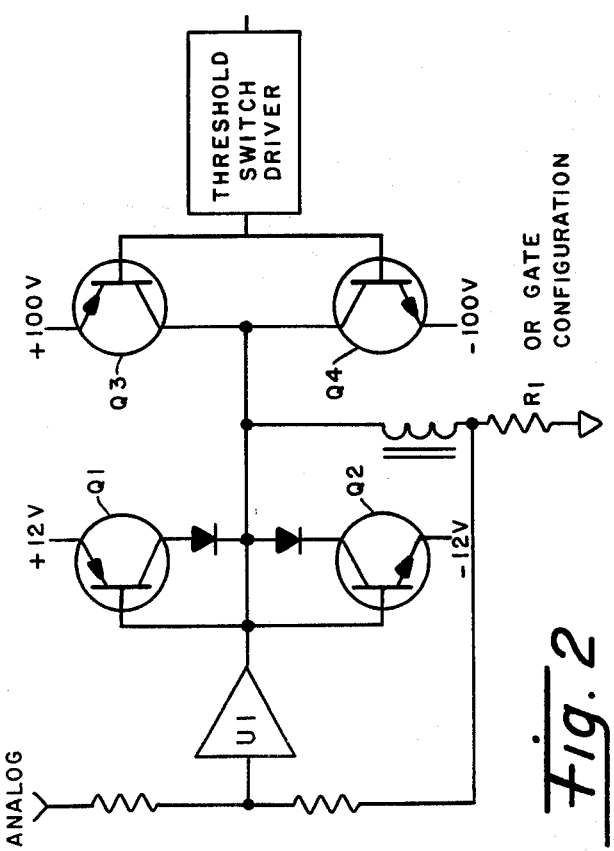

FIGS. 2 and 3 show both "OR" and "BOOST" circuit configurations that may be used in conjunction with a bipolar transconductance amplifier to reduce coil switching time. Operational amplifier U1 and transistors Q1 and Q2 comprise the linear loop. Transistors Q3 and Q4 and a differential threshold driver constitute the nonlinear loop. In the switch boost circuit, transistors Q3 and Q4 boost the $\pm 12$ supply voltage to transistors Q1 and Q2 to $\pm 100$ volts by back-biasing either $\pm 12$ OR gate diode. This elevates the linear loop supply voltage to that level. In the OR-gate configuration, the nonlinear devices (Q3 and Q4) are not included within the linear loop. If switches Q3 and Q4 have little or no storage time, the operation of both configurations is similar. When N and P channel power FET's are used, the storage effect is dismissed. FIG. 4A shows a configuration in which two N-channel power FET's can be used in place of bipolar complementary transistors Q3 and Q4. This scheme can accommodate only switching times that fall within the Vt product of practical pulse transformers.

Figure 4B:
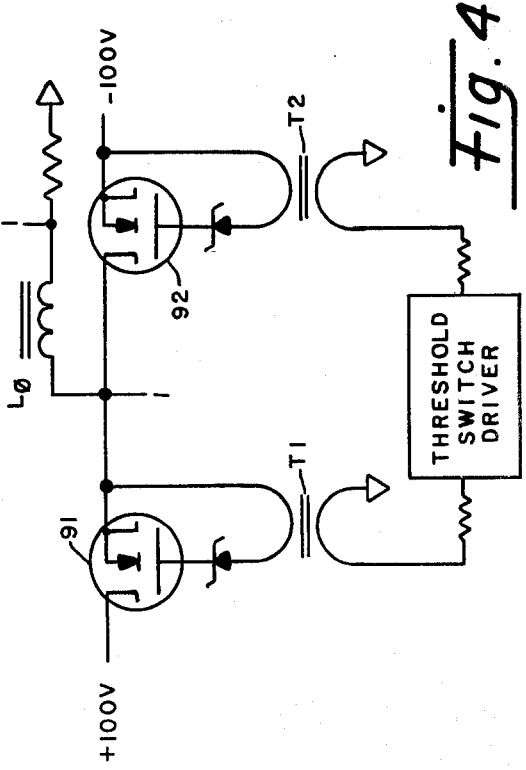

To circumvent the Vt product limitation of the linear pulse transformer used in FIG. 4A, a saturable core or high frequency pulse transformer may be used to program the FET gates, as shown in FIG. 4B. When the output of the switch driver goes positive, a positive voltage spike appears across the secondary of transformer T1. This voltage spike serves to charge up the gate-to-source capacitance of FET 91 causing that transistor to turn on. The voltage amplitude to which the gate capacitance can be charged to is limited by the avalanche voltage of Zener diode 93 (typically 12 volts). This charge is sustained at that level until the video switch driver pulse is terminated. At that time, a negative going spike appears across the secondary of transformer T1. This action thence causes FET 91 to turn off by discharging the gate-to-source capacitance to ground potential. Since the gate-to-source input appears as a 1,000 picofarad capacitor in parallel with 100 megohms of resistance, the time that the FET can sustain an ON state is greater than 100 milliseconds. The minimum ON-to-OFF time is set by the width of the ON voltage spike.

When voltages greater than the drain to source $V_{DS}$ of the FET is required, more than one FET can be operated in series. This configuration has been used to switch voltages in excess of 15 KV.

Figure 5:
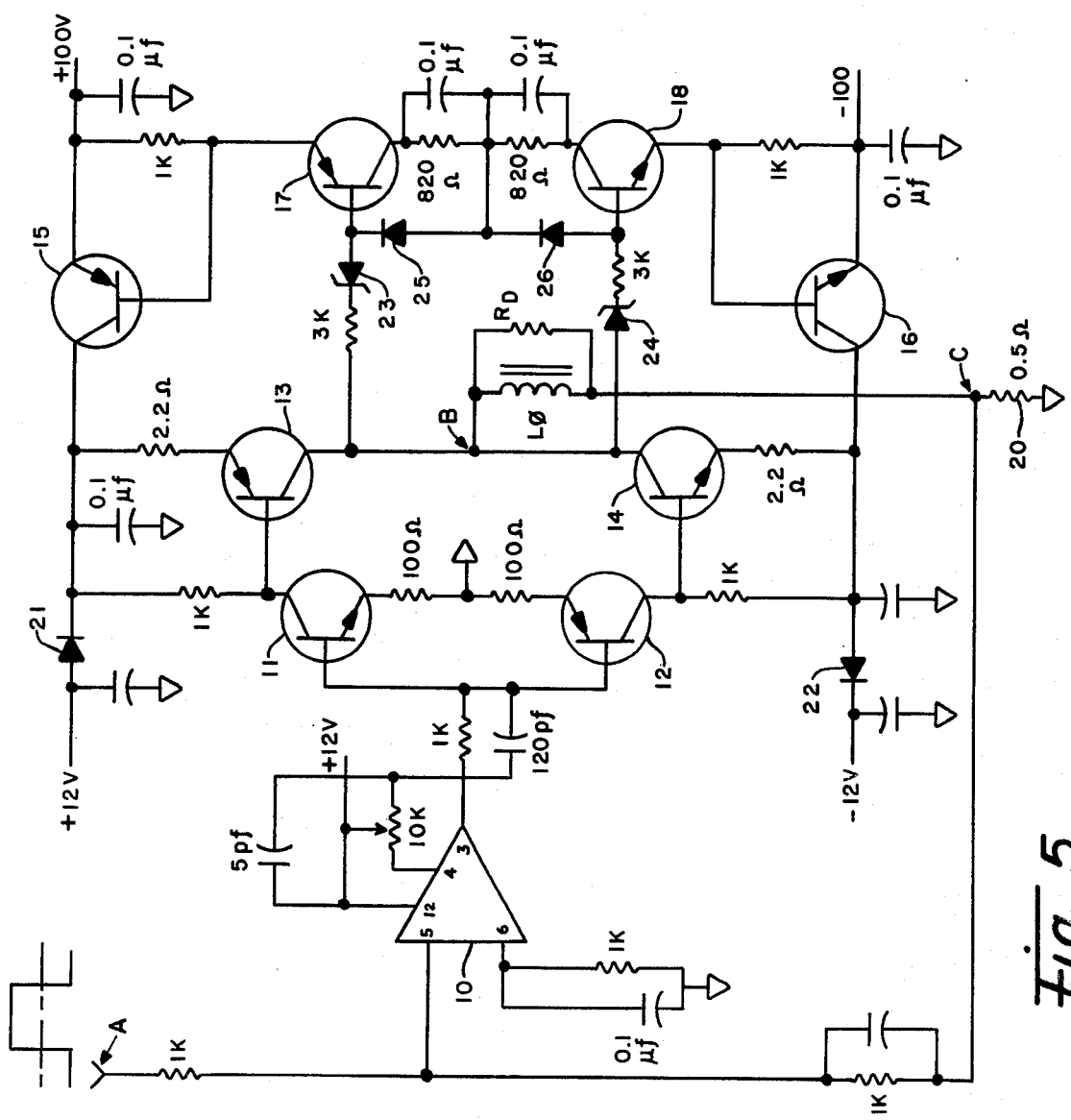
FIGS. 5 and 7 are detailed schematic drawings of two embodiments of the invention.

FIG. 5 shows a schematic of one version of the new phase shifter driver. The configuration is the boost circuit. The current and voltage waveforms of FIG. 6 correspond to the points A, B, and C shown in the diagram. Switching time is on the order of 15 $\mu$secs for a two-ampere change through a 500 $\mu$H inductor. Allowing a twovolt transistor drop, the switching time would be 100 $\mu$secs if only the $\pm 12$ volt supply were used. Because of the extremely fast loop response, the steady state level is established within 20 $\mu$secs, including settling time.

Op-Amp 10 and transistors 11-14 comprise the linear loop. The open loop gain is on the order of 80 dB. At unity gain, the amplifier pulse rise time response is 30 nanoseconds. The voltage boost circuit consists of transistors 15-18. Simple 1N755 zeners 23 and 24 are used to activate the switch circuit when the voltage across the phase shifter L$\emptyset$ exceeds $\pm$ eight volts. The value of damping resistor $R_D$ is chosen to overdamp inductor $L\emptyset$. Then the zener threshold circuit is activated any time the phase command program changes in excess of $L(di/dt)=8$ volts. For a $\pm$ one ampere change this would correspond to a response of about 62 $\mu$sec for the constants shown.

The component types may be:

| OP AMP | Transistors | Diodes |
|---|---|---|
| 10-LH0032 | 11 2N3440 | 21 MR834 |
| | 12 2N3637 | 22 MR834 |
| | 13 2N6211 | 23 1N755 |
| | 14 2N3885 | 24 1N755 |
| | 15 2N6421 | |
| | 16 2N3985 | |
| | 17 2N3440 | |
| | 18 2N3637 | |

Figure 6:
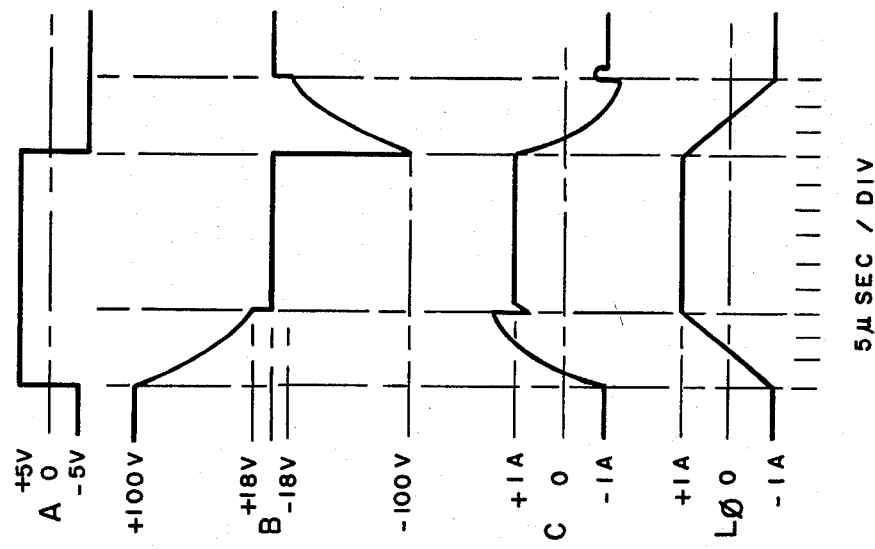
FIG. 6 comprises graphs showing the operation of the circuit of FIG. 5.

In operation, assume that the phase command at the input terminal A requires that the current of inductor $L\emptyset$ be changed from minus one ampere to plus one ampere. The command changes from minus one-half volt to plus one-half volt. This causes the output of the operational amplifier 10 to become a positive value which biases transistor 11 to a conductive state and turns transistor 12 off. This in turn biases transistor 13 to a highly conductive state and turns transistor 14 off. Current then flows from the +12-volt source via diode 21, a 2.2-ohm resistor, and the emitter-collector path of transistor 13 to the phase shift inductor $L\emptyset$. The path to ground is completed via the sense resistor 20. The voltage at point B rises suddenly, and at +8 volts diodes 23 and 25 conduct, and thereby turns on transistor 17. This in turn turns on transistor 15 to a low impedance state. This effectively connects the +100-volt source via transistors 15 and 13 to point B. Diode 21 becomes back-biased to protect the +12-volt source. The current through the parallel combination of inductor $L\emptyset$ and resistor $R_D$ is sensed as a voltage across the sense resistor 20 at point C. As shown in FIG. 6, this current overshoots and then settles back to plus one ampere. The current in the inductor $L\emptyset$ is shown by the lower graph of FIG. 6. The voltage at point C is applied as feedback to the input of the operational amplifier.

FIG. 6 also shows the opposite operation in response to a command to change the current back to minus one ampere. In this case the minus one-half volt analog command at terminal A turns on transistors 12 and 14, while turning off transistors 11 and 13. At $-8$ volts at point B, diodes 24 and 26 conduct to turn on transistors 16 and 18. The $-100$ volt source is then effectively connected via transistors 16 and 14 to point B. Diode 22 is reverse biased to protect the $-12$-volt source.

Figure 7:
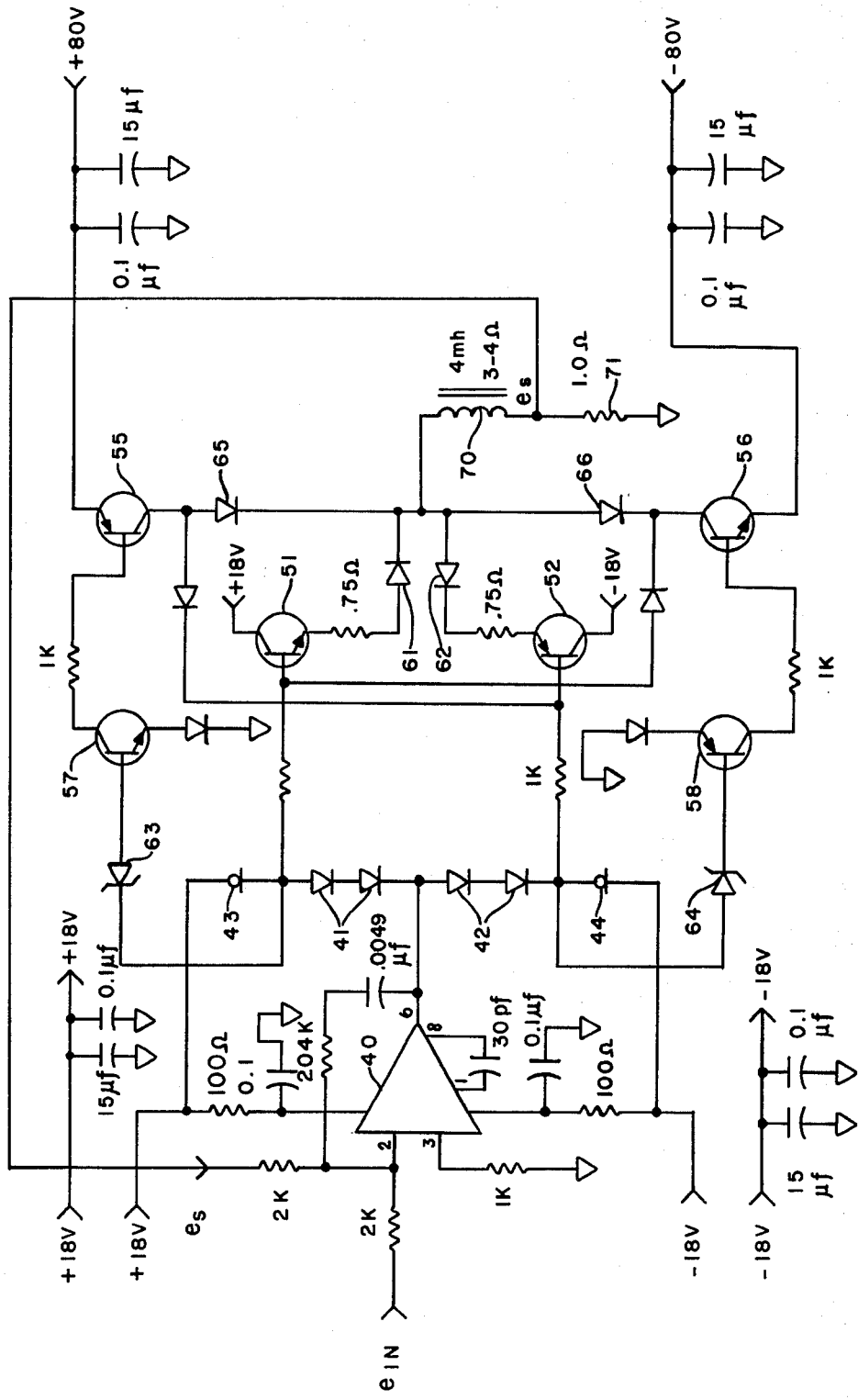

FIG. 7 shows a modified version of the dual mode phase shifter driver. The principal difference from the circuit of FIG. 5 is that the switch threshold command is done at the output of the operational amplifier rather than the final output.

The circuit is a push pull, two level, feedback current driver. The driver has, as an input stage, as externally compensated, high slew rate, operational amplifier. The operational amplifier is followed by a low voltage push pull output stage with current feedback for steady state operation. There is also threshold circuitry for controlling the high voltage switching transistors that are in parallel with the low voltage output stage and operate only while the driver is switching. The low voltage output state is protected from the high switching voltage by blocking diodes.

This configuration is the most desirable because it allows for the greatest amount of commonality.

The external compensation and feedback allow the frequency response to be tailored to fit the phase shifter in use and the two level output allows switching time to be held to a minimum. The number of components in this configuration is small with the intent that it could be built as a PHP package which would result in a large size reduction and allow it to fit many applications. The use of this driver in a large number of applications would result in a significant cost reduction as the design cost would be nonrecurring. The 1N5314 diodes are FET devices providing a current source for bias.

The two-level drive method was chosen in order to achieve a significant reduction in power. The high voltage required for fast switching is only used during switching and is then turned off once the current approaches steady state and not left to be dropped across the output transistors. A typical Fox Phase Shifter coil has a resistance of 3 to 4 ohms and requires approximately 1 to 2 amps to maintain its phase. Beam update times are in the order of 2 ms with required switching times of 200 $\mu$sec. A one-level driver using 50 v to achieve the switching time only dissipates small amounts of power during switching as all the available voltage is applied to the load. However, once switching has been accomplished, the load only requires 3 to 4 volts to maintain 1 amp of current which leaves approximately 45 volts at 1 amp, 45 watts, to be dissipated in the driver for a period of time 10 times longer than that required for switching. The two-level driver realizes a significant reduction in power as the high voltage required for fast switching is turned off in steady state. A low level drive of approximately 5 v is used to maintain the 1 amp holding current in the load which requires 3 to 4 volts leaving 1 volt at 1 amp, 1 watt, to be dissipated in the driver, a savings of 97%. This large reduction in power dissipation would lead directly to a large decrease in cooling equipment required, which would certainly result in a significant size and weight reduction of most systems.

This design was chosen also to be clearly a producible design as there is no necessary trimming and the circuit uses production quality components throughout.

Conclusions

The switched dual voltage approach provides a new generation of coil drivers that may be used in a variety of applications other than phase shifter drivers. Many improvements can be applied to the basic concept. Although higher switching voltages may be used, the ultimate limit of switching speed will be established by the response of the linear loop. In this area, power FET's can be employed to extend the bandwidth. The concept and invention described above can be immediately applied to rapidly switch the phase state of Fox-type rotary field phase shifters for use in adaptive sidelobe cancellation applications. Rapid phase shifter switching, with switching duration magnitudes as described herein, have heretofore been achievable only with diode-type phase shifters.

The device types in FIG. 7 may be as follows:

| | |
|---|---|
| Transistor 51 | 2N6284 |
| Transistor 52 | 2N6287 |

| -continued | |
|---|---|
| Transistor 55 | 2N6421 |
| Transistor 56 | 2N3584 |
| Transistor 57 | 2N3440 |
| Transistor 58 | 2N3637 |
| Amplifier 40 | LM101 |
| Zener's 63, 64 | 1N755, 7.5 v. |
| Diodes 61, 62, 65, 66 | 1N5626 |
| Other diodes | 1N4148 |
| Devices 43, 44 | 1N5314 |

Thus, while preferred constructional features of the invention are embodied fin the structure illustrated herein, it is to be understood that changes and variations may be made by the skilled in the art without departing from the spirit and scope of my invention.

We claim:

1. A driver for rapidly switching the current level in an inductor, said driver comprising a linear loop and a nonlinear loop for supplying current to said inductor;

wherein the linear loop comprises a control circuit, at least one linear amplifying device coupling a low voltage source to the inductor, and sense means for sensing the current in the inductor, the control circuit having input means coupled to an input command terminal and to the sense means, the linear amplifying device having an input terminal coupled to the control circuit, operative to supply current to the inductor as specified by an input signal at the command terminal, and responsive to a change of the input signal, the linear amplifying device goes to a low impedance so that the voltage at the inductor changes rapidly;

wherein the nonlinear loop comprises at least one nonlinear amplifying device coupling a high voltage source to the inductor, threshold means coupled between the linear loop and an input terminal of the nonlinear device, blocking diode means coupled between the nonlinear loop and the linear loop, the nonlinear amplifying device being normally off and operative in response to a given threshold voltage across the threshold means when the voltage changes in the linear loop to bias the nonlinear amplifying device on to a low impedance state to apply said high voltage to the inductor, with the blocking diode means being effective to protect the low voltage source from the high voltage, the nonlinear amplifying device being turned off when the voltage across the threshold means falls below the given value as the current in the inductor approaches the commanded steady state value.

2. A driver according to claim 1, wherein said threshold means comprises Zener diode means.

3. A driver according to claim 2, wherein both the linear and nonlinear loops are push pull circuits, the linear loop having two nonlinear amplifying devices for respectively coupling positive and negative low voltage sources to the inductor, the nonlinear loop having two nonlinear amplifying devices for respectively coupling positive and negative high voltage sources to the inductor, either the positive or the negative voltages being applied to the inductor depending on the input signal at the command terminal.

4. A driver according to claim 3, wherein said linear and nonlinear amplifying devices coupled to the positive voltage sources are PNP type transistors and those coupled to the negative voltage sources are NPN type transistors, each transistor having emitter, base and collector terminals.

5. A driver according to claim 4, wherein the linear and nonlinear loops are coupled together in a boost or series configuration in which the emitter terminals of the PNP and NPN transistors of the nonlinear loop are connected respectively to the positive and negative high voltage sources, the collector terminals of the transistors of the nonlinear loop are coupled to the emitter terminals of the corresponding transistors of the linear loop, and the collector terminals of transistors of the linear loop are connected to the inductor;

wherein the blocking diode means comprises two diodes, one connected from the positive low voltage source to the junction of the PNP transistors, and the other connected from the negative low voltage source to the junction of the NPN transistors.

6. A driver according to claim 5 wherein the nonlinear loop includes an additional NPN transistor and additional PNP transistor between the threshold means and respectively the base terminals of the PNP and NPN transistors;

and wherein the threshold means has two Zener diodes coupled respectively from the collector terminals of the two transistors of the linear loop to base terminals of the additional transistors.

7. A driver according to claim 4 wherein the linear and nonlinear loops are coupled together in an OR gate or parallel configuration in which the emitter terminals of the PNP and NPN transistors of both loops are connected respectively to the corresponding positive and negative voltage sources, and the collector terminals thereof are coupled to the inductor;

wherein the blocking diode means includes two diodes connected between the collector electrodes of the two transistors of the linear loop and the inductor.

8. A driver according to claim 7, wherein the nonlinear loop includes an additional NPN transistor and an additional PNP transistor between the threshold means and respectively the base terminals of said PNP and NPN transistors;

and wherein the threshold means has two Zener diodes coupled from the control circuit to the respective base electrodes of the two additional transistors.

9. A driver according to claim 1, 3, 5, 6, 7 or 8, wherein said control circuit comprises an operational amplifier.

10. A driver according to claim 1 or 3, wherein said nonlinear amplifying devices are FET's, each having a gate terminal coupled via a transformer to said threshold means.

11. A driver according to claim 10, wherein each transformer is a saturable core or high frequency transformer having a primary winding coupled to the threshold means, and a secondary winding coupled via a Zener diode to the gate terminal.

* * * * *